United States Patent [19]

Walters

[11] 4,441,780

[45] Apr. 10, 1984

[54] PLUG AND RECEPTACLE ELECTRICAL CONNECTOR

[75] Inventor: Gerald E. Walters, Granada Hills, Calif.

[73] Assignee: Automation Industries, Inc., Greenwich, Conn.

[21] Appl. No.: 428,768

[22] Filed: Sep. 30, 1982

[51] Int. Cl.³ .......................................... H01R 13/648
[52] U.S. Cl. ........................... 339/143 R; 339/256 RT
[58] Field of Search ..... 339/143 R, 256 RT, 255 RT, 339/257; 179/35 C, 35 MS

[56] References Cited

U.S. PATENT DOCUMENTS

| | | | |
|---|---|---|---|
| 2,154,275 | 4/1939 | Linn | 339/255 RT |
| 3,639,978 | 2/1972 | Schurman | 339/255 RT X |
| 3,835,443 | 9/1974 | Arnold et al. | 339/143 R X |
| 4,033,654 | 7/1977 | Ross | 339/256 RT X |

Primary Examiner—Eugene F. Desmond
Attorney, Agent, or Firm—Francis N. Carten

[57] ABSTRACT

The plug of a plug and receptacle connector has a hollow cylindrical shell of such internal diameter as to permit its receipt onto and over a cylindrical receptacle shell during mating. A groove formed circumferentially about the inner wall of the plug includes a pair of intertwined continuous helically wound springs secured within the groove which wipes along the external wall of the receptacle as it is fitted within the plug. One of the wire springs has a cross-sectional dimension less than that of the other. At crossover points of the springs, they are bonded to one another. When received within the internal groove of the plug part, the large diameter helically wound part of the spring means is secured to the inner wall of the groove by use of a conductive material.

8 Claims, 7 Drawing Figures

PLUG AND RECEPTACLE ELECTRICAL CONNECTOR

The present invention relates to plug and receptacle electrical connector, and more particularly, to an improved means for isolating the interior of the connector from external adverse electromagnetic environments.

BACKGROUND OF THE INVENTION

So-called plug and receptacle connectors include connector parts that are selectively mateable for effecting electrical connection between cable wires. For these connectors to operate satisfactorily, they must be capable of use in adverse environments. An ever increasing adverse environment encountered is that of interference from external radio frequency and electromagnetic fields frequently referred to merely as RFI and EMI. There have been a number of approaches attempted in the past which have been found useful in preventing such interference of relatively low frequency character and shielding devices have been used which involve relatively complex machining and spring type devices which produce electrical contact between the connector parts during mating of the plug and receptacle. However, all such known interference prevention means are not completely satisfactory in one or more respects.

SUMMARY OF THE PRESENT INVENTION

In a plug and receptacle electrical connector with which the present invention is most advantageously employed, the plug part includes generally a hollow cylindrical shell member of such internal diameter as to permit its receipt onto and over a cylindrical receptacle part during mating of the connector parts. A groove formed circumferentially about the entire inner wall of the plug includes a continuous helically wound spring means of special construction secured within the groove which wipes along the external wall of the receptacle as it is fitted within the plug part.

More particularly, the spring means includes two helically wound, highly conductive springs which are intertwined with one another to form a single toroidal-shaped helically wound spring. One of the wire springs has a cross-sectional dimension less than that of the other. At crossover points between the two wire springs, they are bonded to one another. When received within the internal groove of the plug part, the large diameter helically wound part of the spring means is secured to the inner wall of the groove by use of a conductive epoxy, for example, or other means to form a good electrical connection.

In use, as the plug and receptacle are fitted together, the composite toroidal-shaped spring means wipes against and is maintained in continuous contact with the outer surface of the receptacle thereby providing a good conductive path between the connector parts preventing both RFI and EMI pollution of or interference to the wires contained within the connector.

DESCRIPTION OF A PREFERRED EMBODIMENT

Figure 1:
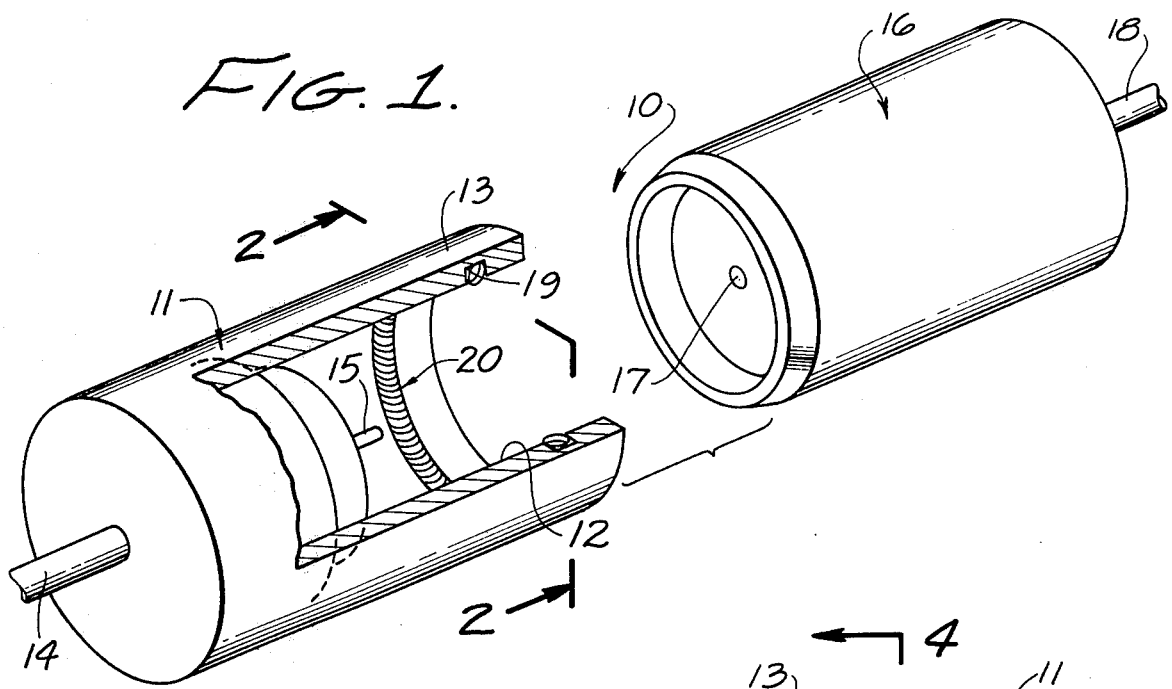
FIG. 1 is a perspective view of a schematically shown electrical connector with the RFI and EMI isolation means described herein.

With reference now to the drawings, and particularly to FIG. 1, an electrical connector of the plug and receptacle type with which the present invention is most advantageously employed, is identified generally as at 10. This connector includes a plug 11 having a metal or conductive cylindrical wall with inner and outer peripheral wall surfaces 12 and 13, respectively. Typically, one or more cable wires 14 interconnect in a conventional manner to electrical contacts such as the pin contact 15 that are located in the plug interior.

The receptacle 16, which is the other half of the connector 10, includes a hollow metal cylinder of such outer diameter as to permit closely fitting receipt within the bore of the plug 11. In a conventional manner, one or more electrical contacts, such as the socket contact 17, are mounted within the receptacle 16 for mating engagement with the plug pin contact/s 15 and in that way effect electrical interconnection between cable wire 14 and a further cable wire 18.

In a practical construction of a plug and receptacle connector 10, there are various other features and devices incorporated into the connector which are necessary or advisable for feasible operation. However, these additional aspects are not necessary for understanding the present invention and therefore are not described.

The plug and receptacle just described include relatively heavy metal shells surrounding the side walls as well as the end wall through which the cable wires are inserted. In addition, the cable wires 14 and 18 typically include a grounded shield which is connected to the connector shells. In this way, except for the open front portions of each of the connector parts, the plug and receptacle cable wires on the interior are shielded to that extent against ambient EMI and RFI interference. On mating of the plug and receptacle together (FIG. 5) and without reference to the special shielding apparatus described herein, the connector parts close upon one another and only leave a small space between the receptacle outer wall and the plug inner wall surface 12 via which EMI and RFI interference can make its way to the electrical contacts and thus to electrical apparatus via the cable wires. As will be described, it is a primary function of the apparatus to be described to seal off the space between the plug and receptacle shells when they are mated together, against the access of electromagnetic radiation to the connector parts interior, and thereby eliminate, or at least substantially reduce, interference from that source.

Figure 2:
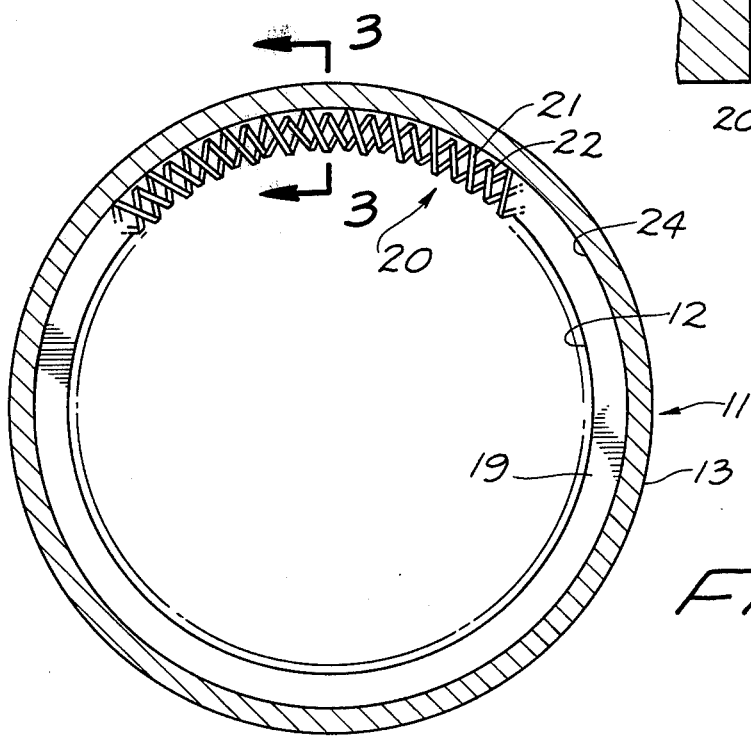
FIG. 2 is a sectional, elevational view taken along the line 2—2 of FIG. 1.

For the ensuing description reference is made simultaneously to FIGS. 1 and 2. The inner surface 12 of the plug shell 11 includes a circumferentially extending groove 19 which is rectangular in cross-section. Within the groove 19 there is located a conductive, resilient coil means 20, to be more particularly described, having parts thereof which extend outwardly of the groove into the bore of the plug and effecting substantially continuous electrical connection between the plug shell and the receptacle shell 16 during mating of the two. That is, as the receptacle 16 is slidingly received within the bore of the receptacle 11, the receptacle outer surface compresses the resilient coil means 20 to effect a substantially continuous interconnection between the outer surface of the receptacle and the inner surface 12 of the plug, and in that way close off or shield the intervening space between the connector parts from the access of external electromagnetic energy.

Figure 4:
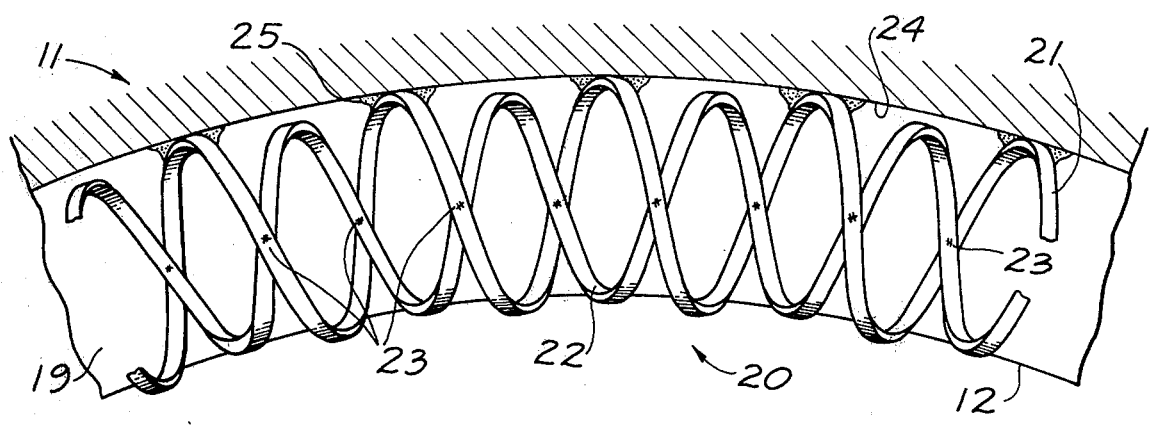
FIG. 4 is a side elevational, partially fragmentary view taken along the line 4—4 of FIG. 3.

Reference is now made to FIGS. 2 and 4 simultaneously. The coil means 20 is generally toroidal shaped and constructed of a first relatively large diameter, continuous helically wound spring 21 and a second continuous helically wound spring of lesser cross-sectional diameter 22. The two coil springs 21 and 22 are interlaced along a common toroidal axis with each cross-over point between the two coil springs being conductively secured to one another by welding, for example, as at 23. Although the cross-over points may be located at different points and still be within the spirit of this invention, it is preferred that the cross-over points lie along a line, the locus of which is a circle having a center of the toroid as its center. The width or diameter D of the larger spring 21 exceeds the depth dimension of the groove 19 so that when the coil means is fully seated within the groove, the inwardly directed portions of the coil spring 21 all extend outwardly of the groove and thus lie within the bore of the plug 11 (FIG. 4).

Figure 3:
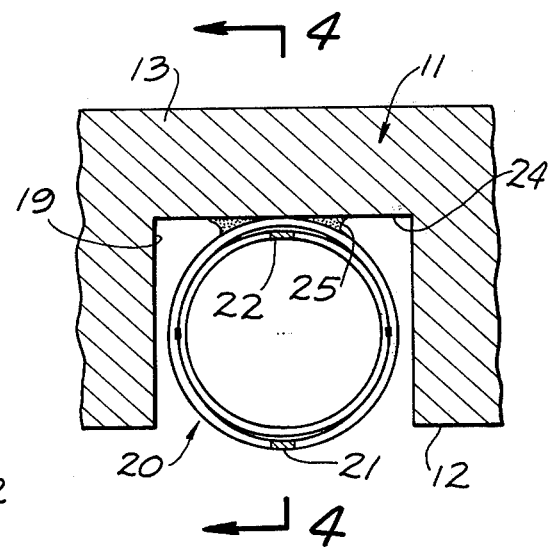
FIG. 3 is a sectional, elevational, greatly enlarged view taken along the line 3—3 of FIG. 2.
Figure 6:
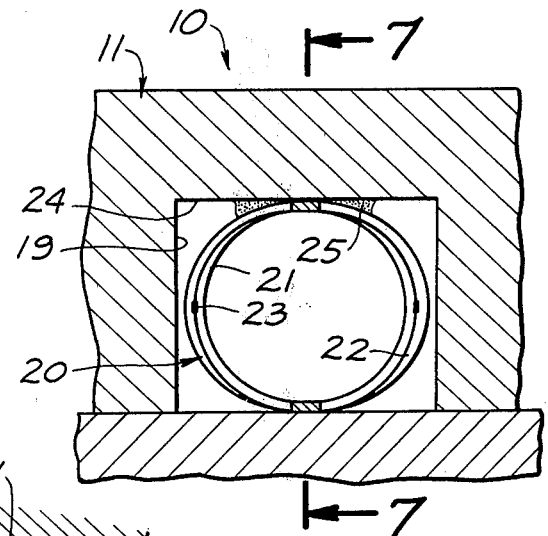
FIG. 6 is a sectional elevational view taken along the line 6—6 of FIG. 5.

When the coil means 20 is located within the groove 19 in a relatively unstressed condition (i.e., with plug and receptacle unmated) the outer edges of the smaller spring 22 are substantially all free from contact of the inner wall 24 of the plug groove 19 (FIG. 4). In assembly, when the coil means 20 is located as shown in FIG. 4 in the unstressed condition within groove 19, it is affixed therein by the use of quantities 25 of a conductive cementitious material, such as epoxy, applied to the peripheral portions of the larger spring 21 thereby affixing that spring, as well as the unitarily related spring 22, to the inner wall 24 of the groove 19 as in FIGS. 3 and 6.

In addition, it is important to note that the two springs 21 and 22 are wound or coiled in opposite directions. That is, as is shown in FIG. 4, the spring 21 is wound going from right to left in the same direction as a righthand screw motion, whereas the spring 22 is wound in a lefthand threaded screw motion. By this construction, the two springs fit together and provide a generally symmetrical arrangement enabling the securing of the springs together at the points 23 along a common circular locus. Moreover, this serves to equalize pressure and force distribution throughout the two coils when the coil means 20 is compressed during use since any twisting motion of the one spring will be compensated by a twisting motion of the other spring in the opposite direction.

Figure 5:
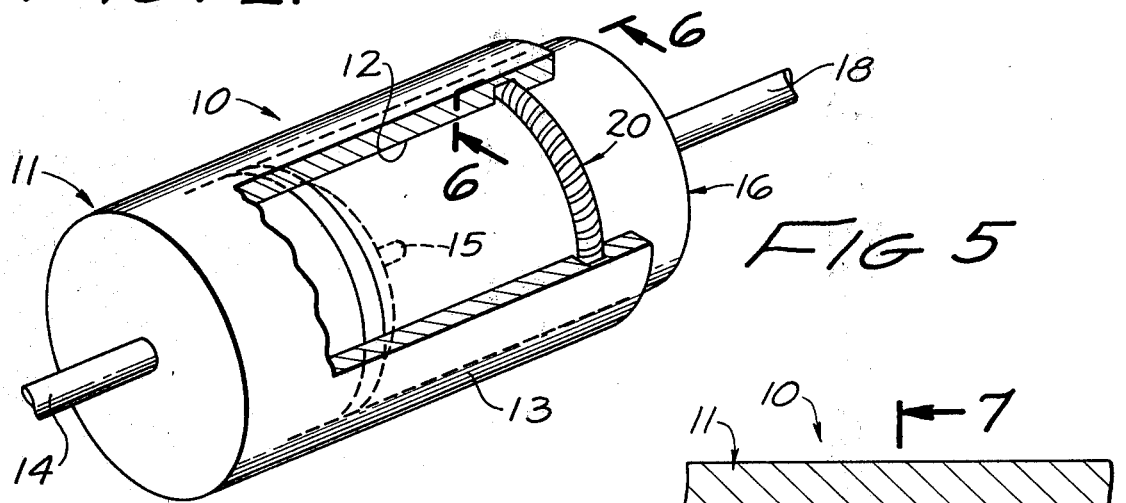
FIG. 5 is a perspective, partially fragmentary view of the connector parts shown engaged.
Figure 7:
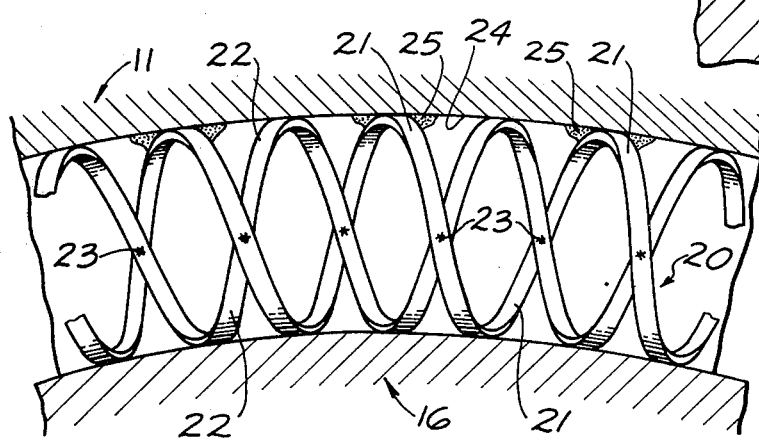
FIG. 7 is a side elevational sectional view taken along the line 7—7 of FIG. 6.

When a receptacle is received within the plug bore as shown in FIGS. 5 and 7, the outer surface of the receptacle contacts the inwardly directed surfaces of the coil spring 21 compressing the spring toward the bottom wall of groove 19. This compression of the spring 21 causes a similar movement of the spring 22 toward the bottom wall of the groove and in fact brings it into contact with both the groove bottom wall 24 and the outer surface of the receptacle as depicted in FIG. 7. By this latter action, the number of contact points between the plug groove bottom wall and the outer surface of the receptacle are increased substantially and thus the electrical interconnection afforded by the two coils 21 and 22 serves to form an interconnecting shield between the two connector parts against the ingress of unwanted electromagnetic and radio frequency energy between the connector part shells. By using two coils which are interwoven with each other, there is a high shading ratio against interfering energy attempting to pass through the coil means as compared, for example, to a coil constructed of a single wire.

The diameter of the larger spring 21 is such relative to the width of groove 19 that when the plug and receptacle are mated this coil spring at most merely contacts the groove side walls. That is, on the full compression experienced during connector mating the coil spring loops are substantially entirely distended transversely of the toroidal axis. There is, of course, some change in the loop angle to the plug wall effected by the typical twisting action between the receptacle and plug as they are mated; however, securing the two counter-wound springs at 23 and providing expansion room in the groove 19 keeps the loop angle change to a minimum.

Although other materials may be found suitable, best results to date have been obtained by making the coil springs 21 and 22 from rectangular cross-section beryllium copper wire which has been gold plated, and with the two coil springs being conductively bonded to one another at points 23.

In addition to mechanical improved operation as described in the preceding paragraphs, there are significant electrical advantages achieved by the described EMI and RFI shielding means. First of all, since the shielding coil means includes two coil springs which are wound in opposite directions and interconnected to one another, electrically they form a very low inductance due to the canceling effect of the opposing turns.

When the present invention is compared to known prior shielding means for a plug and receptacle connector having individual tines or fingers which releasably interconnect the connector parts, an improvement is achieved in that the individual length of unbonded spring material is substantially reduced over the length of spring stock used in the previous constructions. Taking that in conjunction with the reduction in reactance of the connector, the usefulness of a connector having the described shielding coil means is substantially extended into higher wave lengths. For example, the prior art finger stock or tines used as a shielding means became highly inductive at frequencies from 2–4 GHz because the length of these tines or fingers is significant relative to the wavelength at these frequencies. In fact, with those prior constructions, finger or tine shielding means are severely limited in performance above 10 GHz.

I claim:
1. An electromagnetic energy shielding means for receipt within a groove on the inner wall of a plug connector part and which contacts a receptacle connector part when the plug and receptacle connector parts mate, comprising:
   a first helically wound coil spring arranged in a continuous closed path;
   a second helically wound coil spring arranged in a continuous closed path, said second coil spring being interleaved with the first coil spring;

means conductively bonding crossover points of the first and second coil springs; and means for conductively securing one of said spring coils to plug connector part walls defining the groove.

2. An electromagnetic energy shielding means as in claim 1, in which the first and second springs are helically wound in opposite directions.

3. An electromagnetic energy shielding means as in claim 1, in which the means for conductively securing the spring to the plug part groove wall includes conductive epoxy adhesive.

4. An electromagnetic energy shielding means as in claim 1, in which the first coil spring has a maximum transverse dimension greater than that of the second coil spring.

5. An electromagnetic energy shielding means as in claim 4, in which the first and second coil springs are arranged in a generally toroidal path about a common circular axis.

6. An electromagnetic energy shielding means as in either of claims 1 or 2, in which the transverse cross-sectional dimensions of the first and second coil springs are less than the groove width.

7. An electromagnetic energy shielding means as in claim 1, in which the first and second coil springs are constructed of spring wire having a rectangular cross-section.

8. An electromagnetic energy shielding means as in either of claims 1 or 7, in which the first and second coil springs are constructed of a beryllium alloy.

* * * * *